United States Patent
Chang et al.

(10) Patent No.: US 9,298,083 B2
(45) Date of Patent: Mar. 29, 2016

(54) EXTREME ULTRAVIOLET LIGHT (EUV) PHOTOMASKS, AND FABRICATION METHODS THEREOF

(71) Applicant: TAIWAN SEMICONDUCTOR MANUFACTURING COMPANY, LTD., Hsinchu (TW)

(72) Inventors: Ching-Hsu Chang, Xinzhuang (TW); Hung-Chun Wang, Taichung County (TW); Boren Luo, Zhubei (TW); Wen-Chun Huang, Tainan County (TW); Ru-Gun Liu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 127 days.

(21) Appl. No.: 14/279,577

(22) Filed: May 16, 2014

(65) Prior Publication Data
US 2014/0248555 A1  Sep. 4, 2014

Related U.S. Application Data

(62) Division of application No. 12/858,159, filed on Aug. 17, 2010, now Pat. No. 8,764,995.

(51) Int. Cl.
*G03F 1/24* (2012.01)
*G03F 1/58* (2012.01)

(52) U.S. Cl.
CPC ... *G03F 1/58* (2013.01); *G03F 1/24* (2013.01)

(58) Field of Classification Search
CPC ..................................... G03F 1/24; G03F 1/22
See application file for complete search history.

(56) References Cited

U.S. PATENT DOCUMENTS

| | | | |
|---|---|---|---|
| 6,127,257 A | 10/2000 | Pintchovski et al. | |
| 6,350,699 B1 | 2/2002 | Maa et al. | |
| 2003/0027053 A1 | 2/2003 | Yan | |
| 2004/0091789 A1 | 5/2004 | Han et al. | |
| 2004/0131947 A1 | 7/2004 | Gallagher et al. | |
| 2009/0263730 A1* | 10/2009 | Kim ...................... | B82Y 10/00 430/5 |

* cited by examiner

*Primary Examiner* — Stephen Rosasco
(74) *Attorney, Agent, or Firm* — Hauptman Ham, LLP

(57) ABSTRACT

An extreme ultraviolet photomask comprises a reflective layer over a substrate, a capping layer over the reflective layer, a hard mask layer over the capping layer, and an absorber. The absorber is in the hard mask layer, the capping layer and the reflective layer.

20 Claims, 9 Drawing Sheets

EXTREME ULTRAVIOLET LIGHT (EUV) PHOTOMASKS, AND FABRICATION METHODS THEREOF

PRIORITY CLAIM

The present application is a divisional of U.S. application Ser. No. 12/858,159, filed Aug. 17, 2010, which is incorporated by reference herein in its entirety.

FIELD OF THE INVENTION

The present disclosure relates generally to the field of photomasks used in the fabrication of semiconductor devices, and more particularly, to extreme ultraviolet light (EUV) photomasks, and fabrication methods thereof.

BACKGROUND

In the manufacture of integrated circuits (IC), or chips, patterns representing different layers of the chip are created on a series of reusable photomasks (also referred to herein as masks) in order to transfer the design of each chip layer onto a semiconductor substrate during the manufacturing process. The masks are used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask generally comprises a transparent substrate having an opaque, light-absorbing layer disposed thereon. Conventional masks typically include a glass or quartz substrate having a layer of chromium on one side. The chromium layer is covered with an anti-reflective coating and a photosensitive resist. During a patterning process, the circuit design is written onto the mask, for example, by exposing portions of the resist to an electron beam or ultraviolet light, thereby making the exposed portions soluble in a developing solution. The soluble portion of the resist is then removed, allowing the exposed underlying chromium and anti-reflective layers to be etched (i.e., removed).

With the shrink of critical dimensions (CD), present optical lithography is approaching a technological limit at the 28 nanometers (nm) technology node. Next generation lithography (NGL) is expected to replace the current optical lithography method, for example, in the 22 nm technology node and beyond. There are several NGL candidates such as extreme ultraviolet (EUV) lithography (EUVL), electron projection lithography (EPL), ion projection lithography (IPL), nanoimprint, and X-ray lithography. Of these, EUVL is the most likely successor due to the fact that EUVL has most of the properties of optical lithography, which is a more mature technology as compared with other NGL methods.

However, EUV mask fabrication still has technological challenges to overcome. For example, pellicle is used in the conventional chromium masks to prevent any unwanted dusts on the mask to be transferred to the chip. However, pellicle is not feasible to the EUV mask because it will absorb the EUV light. Hence, there is a need to clean the surface of the EUV masks without a pellicle thereon. In addition, there is still a need to monitor the dusts on the surface of the EUV masks.

Thus, there is a need for improved EUV masks and fabrication methods.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
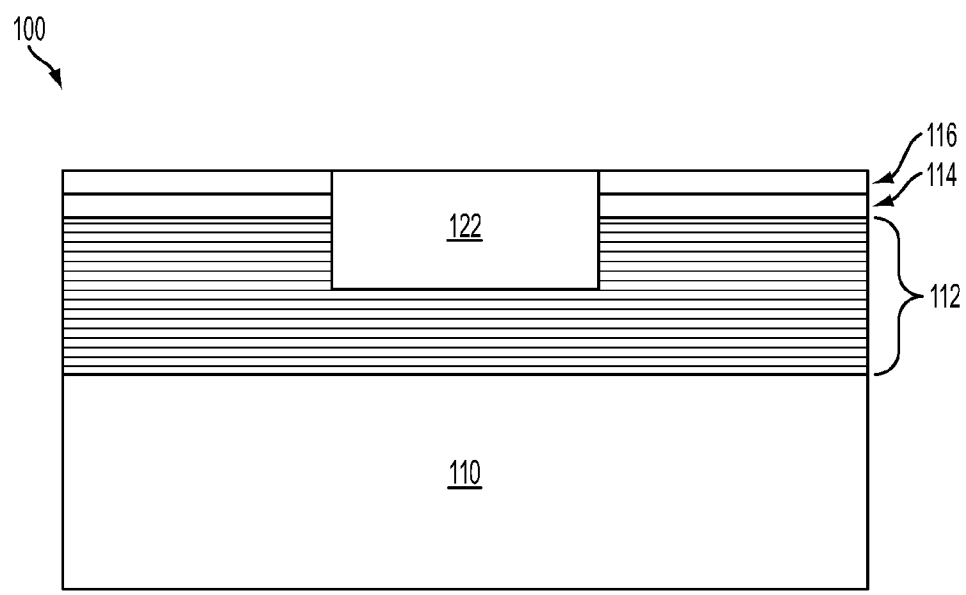
FIG. 1 is a schematic cross-sectional view illustrating an exemplary EUV mask.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic cross-sectional view illustrating an EUV photomask 100. The EUV photomask 100 may use a substrate with the same material and dimensions as conventional masks. In some embodiments, the EUV photomask 100 can include, in order, a substrate 110, an EUV reflective layer 112, a capping layer 114, a hard mask layer 116, and an absorber 122 in an opening penetrating the hard mask layer 116, the capping layer 114, and at least a portion of the EUV reflective layer 112. The absorber 122 has a top surface substantially co-planar with the top surface of the hard mask layer 116, thereby forming an even surface of the EUV photomask 100.

The substrate 110 may be any size suitable for use as a photomask. In one embodiment, the substrate 110 has a rectangular shape with sides between about 5 inches to about 9 inches in length. In another embodiment, the substrate 110 has a thickness ranging about 0.15 inches and about 0.25 inches. In other embodiment, the substrate 110 is about 0.25 inches thick. The substrate 110 typically comprises a silicon-based material, such as quartz (i.e., silicon dioxide, SiO$_2$), and the like.

The EUV reflective layer 112, for example, is a molybdenum and silicon (Mo/Si) containing layer. In some embodiments, the EUV reflective layer 112 is a multi-material layer. In one embodiment, the EUV reflective layer 112 may comprise alternating Mo and Si layers ranging between about 40 pairs and about 50 pairs. Each pair of the Mo and Si layers may comprise a Mo layer with a thickness of about 3 nm and a Si layer with a thickness of about 4 nm. The EUV reflective layer 112 may have an EUV light reflectivity of up to 67% at 13.5 nm wavelength.

The capping layer 114 acts as a combined buffer layer and capping layer between the EUV reflective layer 112 and the hard mask layer 116. In some embodiments, the capping layer 114 is a silicon (Si) layer. The capping layer 114, for example, has a thickness ranging between about 2 nm and about 20 nm.

In one embodiment, the hard mask layer 116 acts as a hard mask for patterning the underlying capping layer 114 and the EUV reflective layer 112. In another embodiment, the hard mask layer 116 acts as a stop layer during a subsequent chemical-mechanical polish (CMP) and/or etching process. In other embodiment, the hard mask layer 116 acts as a protector to protect the underlying capping layer 114 from being oxidized. The hard mask layer 116 may comprise ruthenium (Ru), RuSi, or a combination thereof. In some embodiments, the hard mask layer 116 has a thickness ranging between about 2 nm and about 10 nm.

The absorber 122 is an opaque, light-shielding layer. In one embodiment, the absorber 122 has a thickness not less than about 50 nm to prevent light leakage or poor contrast during the wafer lithography process. In an alternative embodiment, the absorber 122 has a thickness not larger than about 150 nm to prevent the difficulty of performing optical proximity correction (OPC) for forming the mask. In another embodiment, the absorber 122 has a thickness the same as the total thickness of the reflective layer 112 and the capping layer 114. In other embodiment, the absorber 122 has a thickness the same as the total thickness of the reflective layer 112, the capping layer 114, and the hard mask layer 116. In one embodiment, the absorber 122 comprises tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN). In another embodiment, the absorber 122 comprises tantalum- and oxygen-based materials, such as oxidized and nitrogenized tantalum and silicon-based materials (hereinafter TaSiON), tantalum boron oxide-based materials (hereinafter TaBO), and oxidized and nitrogenized tantalum-based materials (hereinafter TaON).

FIGS. 2-7 are schematic cross-sectional views illustrating an exemplary process flow for forming an EUV photomask. Items of FIGS. 2-7 that are the same items in FIG. 1 are indicated by the same reference numerals, increased by 100. With reference to FIGS. 2-7 and 8, an EUV photomask 200 and a method 300 are collectively described below.

Figure 2:
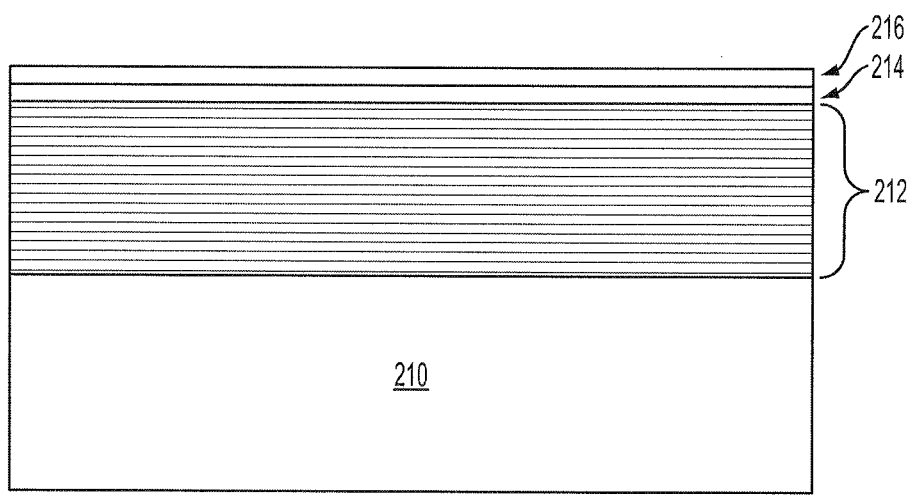
FIGS. 2-7 are various cross-sectional views of embodiments of an EUV mask during various fabrication stages according to the method of FIG. 8.
Figure 8:
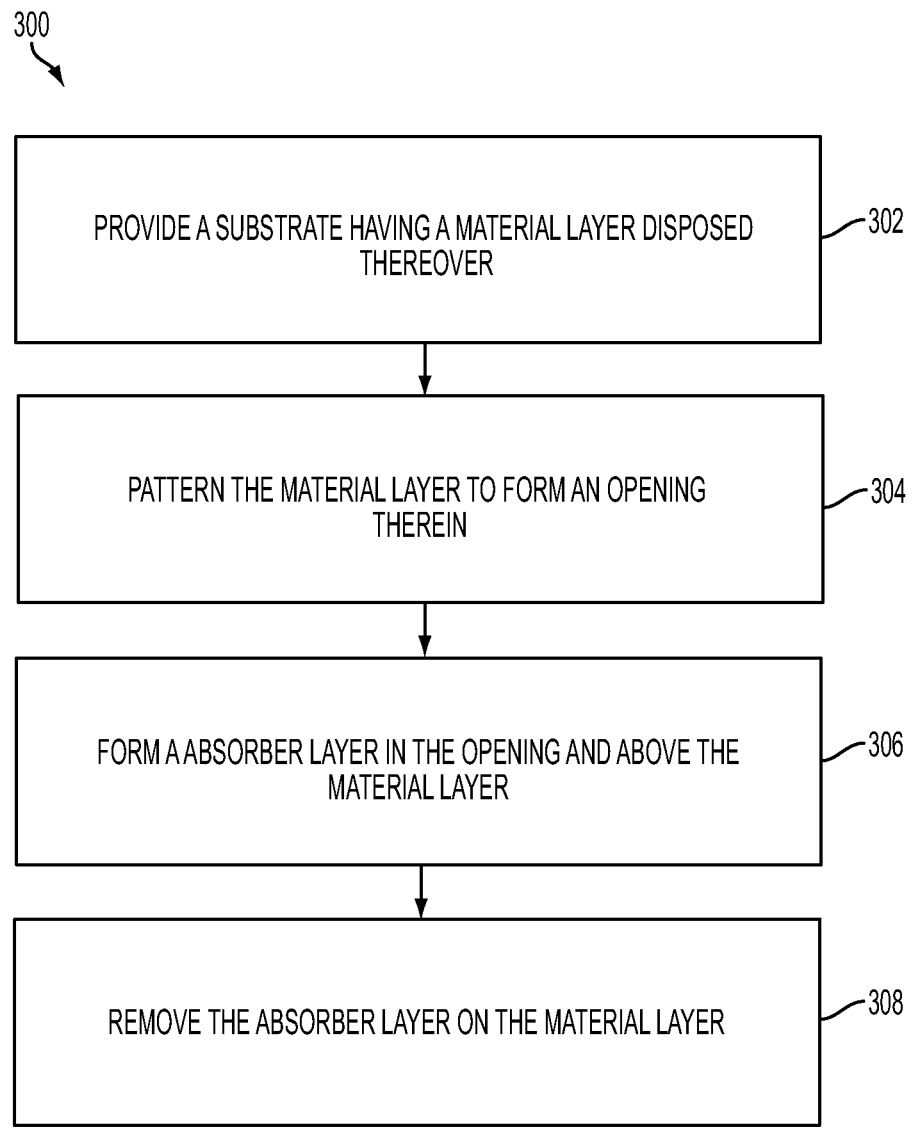
FIG. 8 is a flow chart of a method for fabricating an EUV mask according to aspects of the present disclosure.

Referring to FIGS. 2 and 8, the method 300 begins at step 302 wherein a substrate 210 is provided. The substrate 210 may further comprise material layers including, in order, an EUV reflective layer 212, a capping layer 214, and a hard mask layer 216. The substrate 210 typically comprises a silicon-based material, such as quartz. In some embodiments, the substrate 210 is a rectangular shape substrate with sides ranging between about 5 inches and about 9 inches in length and has a thickness ranging between about 0.15 inches and 0.25 inches.

The EUV reflective layer 212 may be a multi-material layer. The multi-material layer, for example, comprises molybdenum and silicon (Mo/Si) containing layer formed by chemical vapor deposition (CVD), physical vapor deposition (PVD), atomic layer deposition (ALD), and/or another suitable process or processes. In one embodiment, the EUV reflective layer 212 is a multi-layer comprising alternating Mo and Si layers. The EUV reflective layer 212, for example, has about 40 pairs to about 50 pairs of Mo and Si layers. In some embodiments, each pair of the Mo and Si layers has a Mo layer with a thickness of about 3 nm and a Si layer with a thickness of about 4 nm. The EUV reflective layer 212 may have an EUV light reflectivity of up to 67% at 13.5 nm wavelength.

The capping layer 214 generally comprises silicon (Si), formed by CVD, PVD, ALD, and/or other suitable process. In one embodiment, the capping layer 214 has a thickness ranging between about 2 nm and about 20 nm. In another embodiment, the thickness of the capping layer 214 is about 4 nm.

The hard mask layer 216 generally comprises ruthenium (Ru), RuSi, or a combination thereof, formed by CVD, PVD, ALD, and/or other suitable process. In one embodiment, the hard mask layer 216 has a thickness ranging between about 2 nm and about 10 nm. In another embodiment, the thickness of the hard mask layer 216 is about 5 nm.

Figure 3:
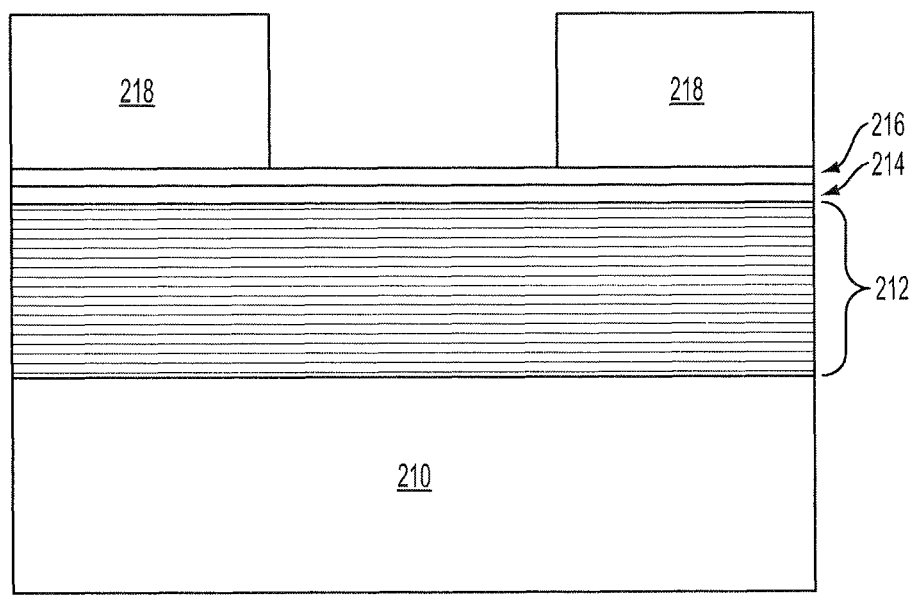

Referring to FIGS. 3-5 and 8, the method 300 continues with step 304 to pattern the hard mask layer 216, the capping layer 214, and the reflective layer 212. The patterning process may include forming a layer of photoresist (not shown) over the hard mask layer 216 by a suitable process, such as spin-on coating, and then exposing and developing the layer of photoresist to form photoresist features 218 (FIG. 3). Additionally, an anti-reflective coating (ARC) layer (not shown) may be optionally formed between the hard mask layer 216 and the layer of photoresist to enhance the patterning process.

Figure 4:
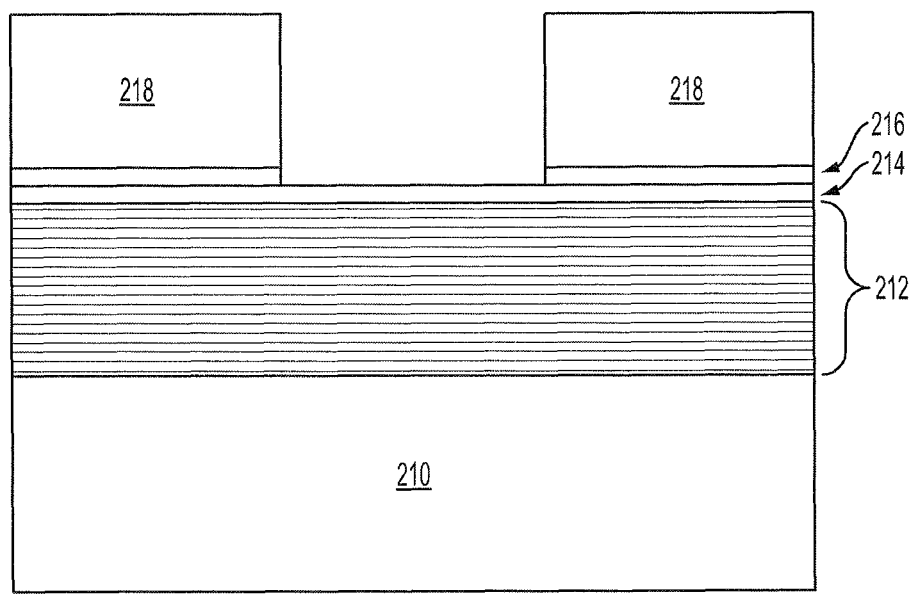

Referring to FIG. 4, an etching process is provided to the EUV photomask 200 to transfer the patterns of the photoresist features 218 to the underlying hard mask layer 216. The hard mask layer 216 is partially covered by the photoresist features 218, wherein the portion of the hard mask layer 216 uncovered by the photoresist features 218 is removed by a first etching process to form an opening therein. In some embodiments, the first etching process is performed by using fluorine-based gas, e.g., CF$_4$, SF$_6$, CF$_3$Cl, or mixtures thereof to remove the uncovered portion of the hard mask layer 216. Then the etching process stops on the underlying capping layer 214 and expose a portion of the capping layer 214.

Figure 5:
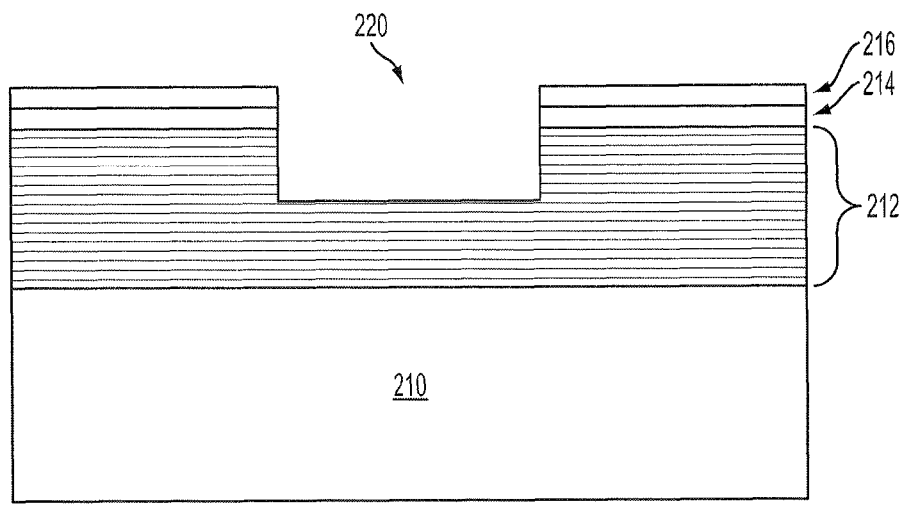

Referring to FIG. 5, the exposed portion of the capping layer 214 is then removed by a second etching process. In some embodiments, the second etching process is performed by using chlorine-based gas, e.g., Cl$_2$ to remove the uncovered portion of the capping layer 214 and expose a portion of the underlying EUV reflective layer 212. In one embodiment, at least a portion of the underlying EUV reflective layer 212 is continuously removed after the removal of the capping mask layer 214 during the second etching process. In another embodiment, at least a portion of the underlying EUV reflective layer 212 is removed by a separate etching process different from the second etching process. In some embodiments, the EUV reflective layer 212 is removed by using Cl$_2$, F$_2$, or mixture thereof. In one embodiment, the EUV reflective layer 212 is partially removed to a thickness ranging between about 50 nm and about 150 nm. In another embodiment, the EUV reflective layer 212 is completely removed and stops on the surface of the substrate 210.

Still referring to FIG. 5, the photoresist features 218 may be removed after the etching process of the hard mask layer 216, after the etching process of the capping layer 214, or after the etching process of the EUV reflective layer 212. In some embodiments, the removal of the photoresist features 218 is performed by implementing a wet stripping and/or plasma ashing. For example, an oxygen plasma ashing may be implemented to remove the photoresist features 218. An opening 220 is formed in the reflective layer 212, the capping layer 214, and the hard mask layer 216.

Figure 6:
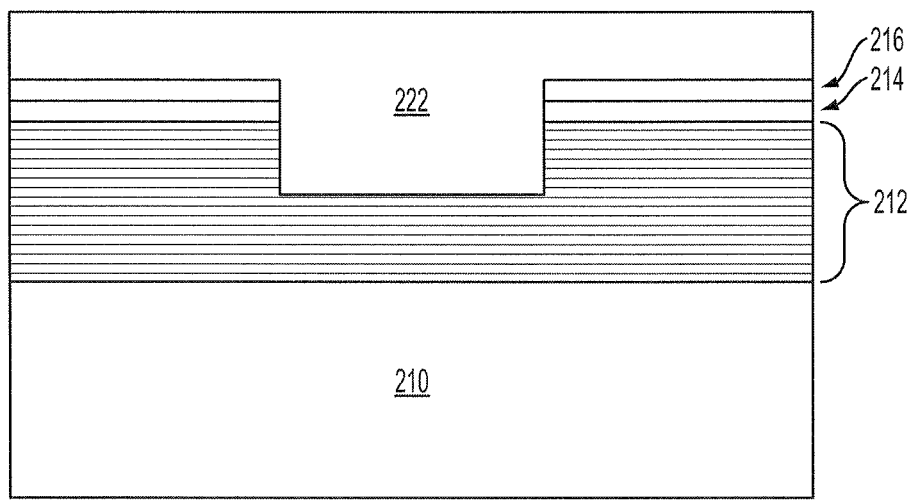

Referring to FIGS. 6 and 8, the method 300 continues with step 306, wherein an absorber layer 222 is filled in the opening 220 and above the top surface of the hard mask layer 216. The absorber layer 222 is an opaque, light-shielding layer and may have a thickness ranging between about 100 nm and about 500 nm. In one embodiment, the absorber layer 222 comprises tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN). In another embodiment, the absorber layer 222 comprises tantalum- and oxygen-based materials, such as oxidized and nitrogenized tantalum and silicon-based materials (hereinafter TaSiON), tantalum boron oxide-based materials (hereinafter TaBO), and oxidized and nitrogenized tantalum-based materials (hereinafter TaON). The absorber layer 222 may be deposited using PVD such as sputtering and evaporation; plating; CVD such as plasma enhanced CVD (PECVD), atmospheric pressure CVD (APCVD), low pressure CVD (LPCVD), high density plasma CVD (HDPCVD) and atomic layer CVD (ALCVD); other suitable deposition processes; and/or combinations thereof.

Figure 7:
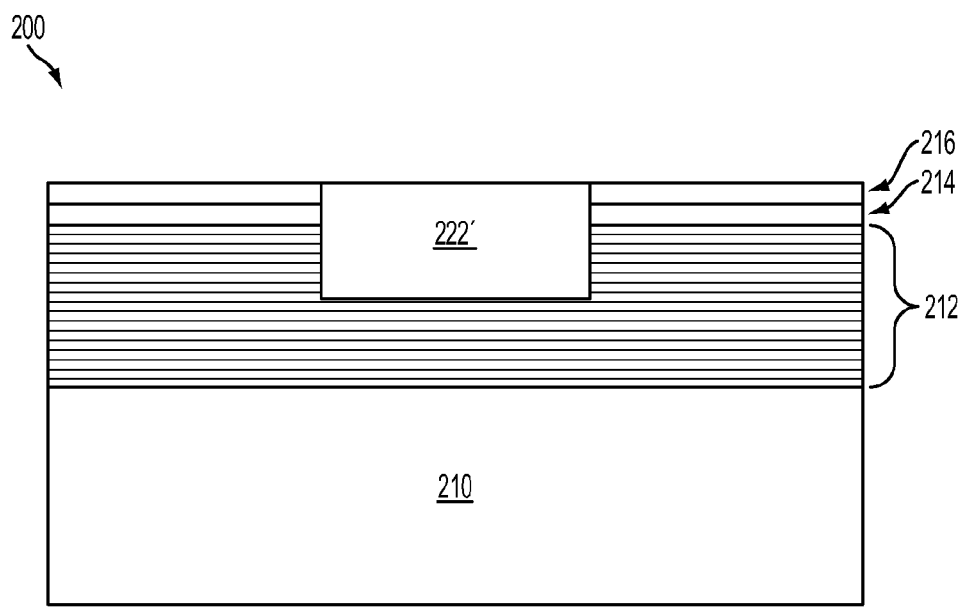

Referring to FIGS. 7 and 8, the method 300 continues with step 308, wherein a removing process is provided to the absorber layer 222. The portion of the absorber layer 222 which is above the opening 220 and the hard mask layer 216 is removed to form an absorber 222' in the opening 220. The top surface of the absorber 222' is substantially co-planar with the top surface of the hard mask layer 216 such that the absorber 222' and the hard mask layer 216 constitute a planarized (even) surface of the EUV mask 200. In one embodiment, the removing process may include a chemical-mechanical polish (CMP) process by using fluoride-base slurry. In another embodiment, the removing process may include a dry etch process by using $CF_4$, $Cl_2$, or a mixture thereof. In other embodiment, the removing process is conducted by a CMP process first to remove a portion of the absorber layer 222 and leave some of the absorber layer 222 above the opening 220 and the hard mask layer 216. Then, a dry etching process is provided to remove the remaining absorber layer 222 to form the absorber 222' with a surface co-planar with the top surface of the hard mask layer 216. During the CMP or the dry etching process, the hard mask layer 216 may act as a stop layer to stop the CMP or the dry etching process thereon.

Figure 9:
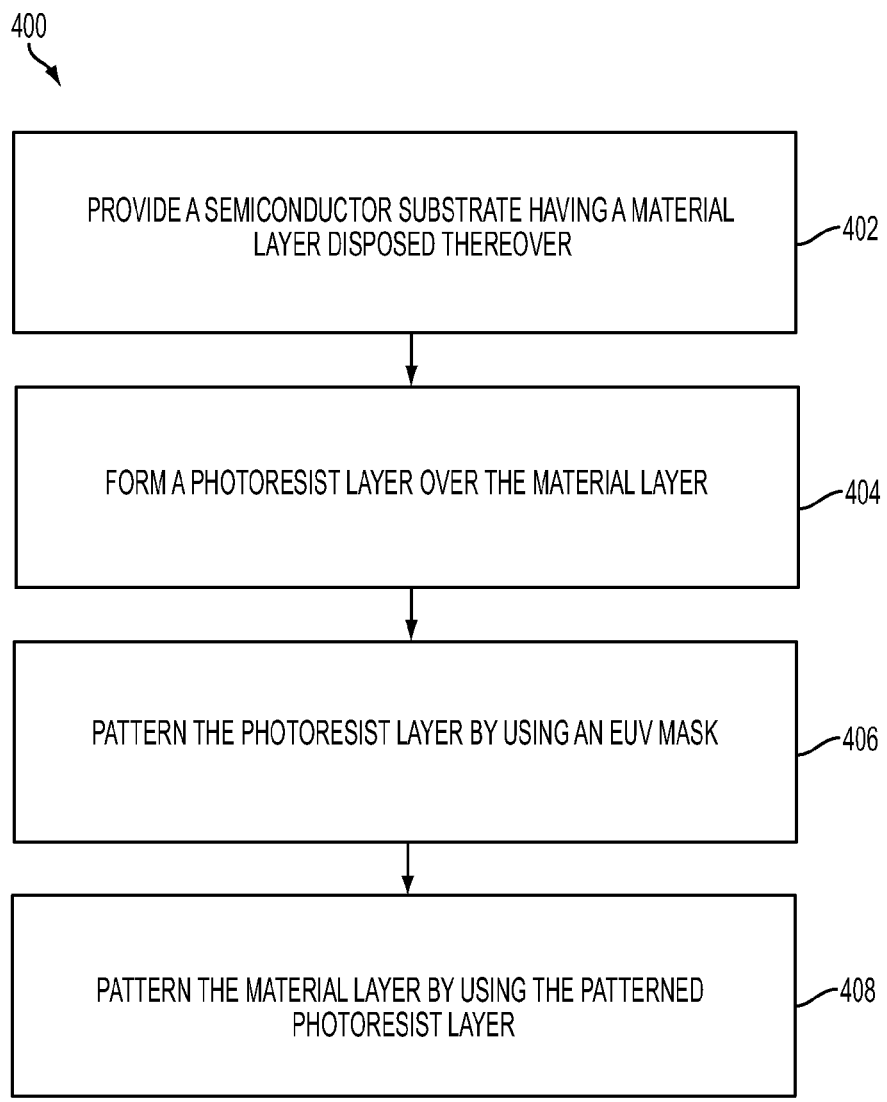
FIG. 9 is a flow chart of a method for fabricating an integrated circuit device using an EUV mask according to aspects of the present disclosure.

Referring to FIG. 9, a flow chart of a method 400 for fabricating an integrated circuit device by using an EUV mask is described below. The method 400 begins at step 402, wherein a semiconductor substrate having a material layer is provided. The method 400 continues with step 404 to form a photoresist layer over the material layer. Then, the method 400 continues with step 406 to pattern the photoresist layer by using an EUV mask as described above in a lithography process. The method 400 continues with step 408 to pattern the material layer by using the patterned photoresist layer as an etch mask.

It is noted that the EUV masks with the planarized surface are easily cleaned. In addition, dust-monitoring processes are easily performed on the EUV masks having the planarized surface.

It is noted that the integrated circuit devices processed by using the EUV masks are likely to prevent unwanted dust particles on the mask to be transferred to the chip.

It is noted that the method described above in conjunction with FIGS. 2-7 is merely exemplary. One of skill in the art can modify the flow of the method to achieve desired EUV photomask. For example, the removing process for removing portions of the absorber layer 222 may form an absorber 222' with a top surface slightly lower than or higher than the top surfaces of the hard mask layer 216.

In still other embodiments, the hard mask layer 216 may be removed during a removing process such that the top surface of the absorber 222' may substantially level with the top surface of the capping layer 214.

An aspect of this description relates to an extreme ultraviolet photomask that comprises a reflective layer over a substrate, a capping layer over the reflective layer, a hard mask layer over the capping layer, and an absorber. The absorber is in the hard mask layer, the capping layer and the reflective layer.

Another aspect of this description relates to an extreme ultraviolet photomask that comprises a reflective layer over a substrate. The reflective layer has a first thickness. The extreme ultraviolet photomask also comprises a capping layer over the reflective layer, a hard mask layer over the capping layer, and an absorber layer in and over a top surface of the hard mask layer. The absorber layer has a second thickness greater than the first thickness.

Still another aspect of this description relates to an extreme ultraviolet photomask that comprises a reflective layer over a substrate. The reflective layer has a first thickness and comprises alternating first layers and second layers. The first layers each are thicker than the second layers. The extreme ultraviolet photomask also comprises a capping layer over the reflective layer, a hard mask layer over the capping layer, and an absorber layer in and over a top surface of the hard mask layer. The absorber layer has a second thickness greater than the first thickness.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet photomask, comprising:
   a reflective layer over a substrate;
   a capping layer over the reflective layer;
   a hard mask layer over the capping layer; and
   an absorber in the hard mask layer, the capping layer and the reflective layer.

2. The extreme ultraviolet photomask of claim 1, wherein the absorber is substantially co-planar with the top surface of the hard mask layer.

3. The extreme ultraviolet photomask of claim 1, wherein the hard mask layer comprises ruthenium (Ru), RuSi, or a combination thereof.

4. The extreme ultraviolet photomask of claim 1, wherein the capping layer comprises silicon (Si).

5. The extreme ultraviolet photomask of claim 1, wherein the absorber comprises TaSi, TaBN, TaN, TaSiON, TaBO, or TaON.

6. The extreme ultraviolet photomask of claim 1, wherein the reflective layer comprises a molybdenum and silicon (Mo/Si) containing layer.

7. The extreme ultraviolet photomask of claim 1, wherein the reflective layer comprises alternating Mo and Si layers ranging between about 40 pairs and about 50 pairs.

8. An extreme ultraviolet photomask, comprising:
a reflective layer over a substrate, the reflective layer having a first thickness;
a capping layer over the reflective layer;
a hard mask layer over the capping layer; and
an absorber layer in and over a top surface of the hard mask layer, the absorber layer having a second thickness greater than the first thickness.

9. The extreme ultraviolet photomask of claim 8, wherein the absorber layer is substantially co-planar with the top surface of the hard mask layer.

10. The extreme ultraviolet photomask of claim 8, wherein the hard mask layer comprises ruthenium (Ru), RuSi, or a combination thereof.

11. The extreme ultraviolet photomask of claim 8, wherein the capping layer comprises silicon (Si).

12. The extreme ultraviolet photomask of claim 8, wherein the absorber layer comprises TaSi, TaBN, TaN, TaSiON, TaBO, or TaON.

13. The extreme ultraviolet photomask of claim 8, wherein the reflective layer comprises a molybdenum and silicon (Mo/Si) containing layer.

14. The extreme ultraviolet photomask of claim 8, wherein the reflective layer comprises alternating Mo and Si layers ranging between about 40 pairs and about 50 pairs.

15. An extreme ultraviolet photomask comprising:
a reflective layer over a substrate, the reflective layer having a first thickness and comprising alternating first layers and second layers, the first layers each being thicker than the second layers;
a capping layer over the reflective layer;
a hard mask layer over the capping layer; and
an absorber layer in and over a top surface of the hard mask layer, the absorber layer having a second thickness greater than the first thickness.

16. The extreme ultraviolet photomask of claim 15, wherein the absorber layer is substantially co-planar with the top surface of the hard mask layer.

17. The extreme ultraviolet photomask of claim 15, wherein the hard mask layer comprises ruthenium (Ru), RuSi, or a combination thereof.

18. The extreme ultraviolet photomask of claim 15, wherein the capping layer comprises silicon (Si).

19. The extreme ultraviolet photomask of claim 15, wherein the absorber layer comprises TaSi, TaBN, TaN, TaSiON, TaBO, or TaON.

20. The extreme ultraviolet photomask of claim 15, wherein the alternating first layers and second layers of the reflective layer are alternating Mo and Si layers ranging between about 40 pairs and about 50 pairs.

* * * * *